United States Patent
Gaarder

(10) Patent No.: US 10,393,777 B2
(45) Date of Patent: Aug. 27, 2019

(54) METHOD AND APPARATUS FOR MONITORING POWER GRID PARAMETERS

(71) Applicant: Ably AS, Oslo (NO)

(72) Inventor: Paal Even Gaarder, Oslo (NO)

(73) Assignee: LIVE POWER INTELLIGENCE COMPANY NA, LLC, Princeton, NJ (US)

( * ) Notice: Subject to any disclaimer, the term of this patent is extended or adjusted under 35 U.S.C. 154(b) by 0 days.

(21) Appl. No.: 14/892,715

(22) PCT Filed: May 26, 2014

(86) PCT No.: PCT/EP2014/060839
§ 371 (c)(1),
(2) Date: Nov. 20, 2015

(87) PCT Pub. No.: WO2014/188003
PCT Pub. Date: Nov. 27, 2014

(65) Prior Publication Data
US 2016/0091537 A1    Mar. 31, 2016

(30) Foreign Application Priority Data

May 24, 2013    (GB) .................................. 1309384.4

(51) Int. Cl.
*G01R 21/06*    (2006.01)
*G01R 25/00*    (2006.01)
(Continued)

(52) U.S. Cl.
CPC ............. *G01R 21/00* (2013.01); *G01R 25/00* (2013.01); *G01R 31/40* (2013.01); *G06Q 10/00* (2013.01);
(Continued)

(58) Field of Classification Search
CPC ........ G01R 21/00; G01R 21/06; G01R 25/00; G01R 27/04; G01R 31/40
(Continued)

(56) References Cited

U.S. PATENT DOCUMENTS 6,714,000 B2    3/2004 Staats
6,771,058 B2    8/2004 Lapinksi et al.
(Continued)

FOREIGN PATENT DOCUMENTS

EP    1297347 B1    4/2003
JP    2000152501 A    5/2000
(Continued)

OTHER PUBLICATIONS

"Slik drives strøm-spionasje", Økonomisk Rapport Apr. 2006, 40-41.

*Primary Examiner* — Neel D Shah
(74) *Attorney, Agent, or Firm* — 24IP Law Group USA, PLLC; Timothy DeWitt

(57) ABSTRACT

A system and method for measurement of one or more parameters of a power grid (10) is disclosed. This comprises determining a plurality of events in at least one power waveform on the power grid using at least two sensors (30, 50) and recording timings of the plurality of events in at least two different locations in the power grid. The data gathered is used to determine differences between the timings recorded in the at least two locations. A processing unit (40) is used to analyze the differences of the timings to determine the one or more parameters. These parameters include power flow, short circuits, and breaks in the power grid (10).

18 Claims, 4 Drawing Sheets

(51) Int. Cl.

| | | |
|---|---|---|
| *G01R 27/04* | (2006.01) | |
| *G01R 31/40* | (2014.01) | |
| *G01R 21/00* | (2006.01) | |
| *H02J 13/00* | (2006.01) | |
| *G06Q 10/00* | (2012.01) | |
| *H04Q 9/00* | (2006.01) | |
| *H02J 3/00* | (2006.01) | |
| *H02J 3/01* | (2006.01) | |
| *H02J 3/16* | (2006.01) | |
| *H02J 3/18* | (2006.01) | |
| *G01R 19/25* | (2006.01) | |

(52) U.S. Cl.
CPC ........... H02J 13/0006 (2013.01); H04Q 9/00 (2013.01); *G01R 19/2513* (2013.01); *H02J 3/008* (2013.01); *H02J 3/01* (2013.01); *H02J 3/16* (2013.01); *H02J 3/18* (2013.01); *H02J 13/0062* (2013.01); *H04Q 2209/60* (2013.01); *Y02E 40/34* (2013.01); *Y02E 40/40* (2013.01); *Y02E 40/74* (2013.01); *Y02E 60/726* (2013.01); *Y02E 60/74* (2013.01); *Y02E 60/7838* (2013.01); *Y04S 10/22* (2013.01); *Y04S 10/24* (2013.01); *Y04S 10/30* (2013.01); *Y04S 40/124* (2013.01); *Y04S 50/10* (2013.01)

(58) Field of Classification Search
USPC ................................ 324/764.01, 629; 702/60
See application file for complete search history.

(56) References Cited

U.S. PATENT DOCUMENTS

| | | |
|---|---|---|
| 7,519,454 B2 | 4/2009 | Gardner |
| 8,457,912 B1* | 6/2013 | Wells ................ H02J 3/24 702/62 |
| 2004/0025496 A1* | 2/2004 | Patterson, Jr. .......... F41H 11/00 60/254 |
| 2006/0247874 A1 | 11/2006 | Premerlani et al. |
| 2007/0059986 A1 | 3/2007 | Rockwell |
| 2008/0077336 A1 | 3/2008 | Fernandes |
| 2008/0189061 A1 | 8/2008 | Scholtz |
| 2009/0289637 A1 | 11/2009 | Radtke |
| 2011/0010118 A1* | 1/2011 | Gaarder ................ G01R 21/133 702/60 |
| 2011/0208364 A1 | 8/2011 | Deloach |
| 2012/0173174 A1* | 7/2012 | Gaarder ................ G01R 31/086 702/58 |
| 2012/0187770 A1* | 7/2012 | Slota .................. H02J 3/42 307/87 |
| 2012/0217975 A1* | 8/2012 | Drazan ................ G01R 15/142 324/522 |
| 2012/0310559 A1 | 12/2012 | Taft |
| 2013/0024149 A1 | 1/2013 | Nayar et al. |
| 2013/0073108 A1 | 3/2013 | Kolwalkar |

FOREIGN PATENT DOCUMENTS

| | | |
|---|---|---|
| WO | 2006112839 | 10/2006 |
| WO | 2007/030121 | 3/2007 |
| WO | 2007/070255 A2 | 6/2007 |
| WO | 2008143520 | 11/2008 |
| WO | 2013/001355 A2 | 1/2013 |
| WO | 2013135773 A1 | 9/2013 |

* cited by examiner

Scheme A:

Scheme B:

Scheme C:

METHOD AND APPARATUS FOR MONITORING POWER GRID PARAMETERS

CROSS-REFERENCE TO RELATED APPLICATIONS

This application is related to U.S. patent application Ser. No. 12/678,272 "Method and Apparatus for monitoring Power Transmission" which is a national phase entry of international patent application No. PCT/EP2008/061997 filed on 10 Sep. 2008 claiming priority of U.S. Provisional patent application No. 60/973,046 filed on 17 Sep. 2007 and U.S. Provisional patent application No. 60/975,946 filed on 2 Oct. 2007.

This method is also related to U.S. patent application Ser. No. 13/418,887 filed on 10 Mar. 2013 entitled "Method and Apparatus for Monitoring Electric Power Transmission, Disturbances and Forecasts".

The subject matter of both of these applications is incorporated herein by reference.

FIELD OF THE INVENTION

The field of the present invention relates to an apparatus and method for monitoring parameters of a power grid, such as but not limited to power transmission, in particular the flow, direction and stability of power

BACKGROUND OF THE INVENTION

The traditional monopolies of electrical utility companies have been relaxed in the past few years in the European Union, in the United States and in other countries. There has developed as a result a growing wholesale electricity supply market for electrical power. Utility companies, independent power producers, and power marketers as well as brokers are some of the participants in the volatile electricity supply market. It is known, for example, that variables such as the time of day and date, weather, temperature and oil prices play a role in the pricing of electricity in a given region. Similarly the way in which the electrical power transmission line (or power grid) and the pricing of electricity play a role for in the storage of fuel, such as oil, and other commodities.

Furthermore, the pricing of the electricity is dependent on the operational status of electricity supply generators and use of facilities as well as the transmission capacity of an electric power transmission network (also called a power grid). The participants in the electricity supply markets require access to substantially real-time information as well as historical data on the operational status of the electricity supply generation and use facilities as well as the electric power transmission lines in the region. This information allows the development of trading strategies in electric power and responses to power system events (such as disruptions in the power grid due to failures of transformers).

The relaxation of the monopoly status of traditional electric utility companies has resulted in increased competition for customers among suppliers of electric power. Information relating to the use of electric power by the potential customers would be useful to those involved in the bidding for electrical supply contracts. It would also be advantageous to determine information on the supply and the demand of the electric power over time without having to directly connect to the electrical power transmission lines.

There is also a requirement to monitor the power grid in order to ensure an increasing stability of the power grid. The power grid increase in size and complexity. This, in addition to faster trading of power (US), increases the need for fast and more direct measurement of the grid conditions to be able to adjust these grid conditions within the time frames needed to avoid an oscillating system.

One of the issues related to the relaxation of the monopoly status of traditional electric utilities is the requirement to determine power system disturbances in the power grid. U.S. Pat. No. 7,519,454 (Gardner et al., assigned to Virginia Tech Intellectual Properties) teaches a system for detecting and locating the disturbance events within the power grid. The system includes a series of frequency disturbance recorders taking measures in the power grid at disparate points of the power grid and an information management system, which is configured to receive data from the series of the recorders and to analyse the received data. The frequency data recorders include a low pass filter to eliminate high frequency components in a measured 110V AC signal from an outlet socket located in an office or in a home. The system of U.S. '454 further includes a communications network interconnecting the series of frequency data recorders and the information management system. The information management system is configured to examine orders and patterns of receipt of the frequency changes caused by the disturbance event and to triangulate a location of the disturbance event based on the orders and patterns of receipt of the frequency changes. The teachings of the U.S. '454 patent require the measurement of a complete cycle of the frequency to determine a change in the frequency and also lose information by eliminating the high frequencies in the 110V AC signal.

Methods and systems for the measurement for the electric power transmission are known from several prior art documents. For example U.S. Pat. No. 6,714,000 (Staats, assigned to Genscape, Inc.) teaches a method for the remote monitoring of the magnitude and the direction of net electrical power and current flow to or from a facility monitored over a prolonged period of time. The method described in the Staats U.S. '000 Patent includes the detection and the measurement of the magnetic field emanating from the monitored electrical power transmission lines and detecting a signal that is synchronized to the power system frequency emanating from the power lines. The method further includes evaluation, storing and transmission of the data on the electromagnetic field that emanates from the electrical power transmission line.

A further International Patent Application No. WO2006/112839 (Genscape Intangible Holding, Inc.) also teaches a method and a system for the substantially real-time monitoring of the operational dynamics of power plants and other components in an AC power grid. The monitoring is done by using information collected from a network of power grid frequency detection and reporting devices. The invention allows for the real-time detection and reporting of certain power grid events, such as a power plant trips or failures.

International Patent Application No. WO2007/030121 (Genscape Intangible Holding, Inc.) teaches a system for monitoring the power flow along an electric power transmission line that includes a plurality of magnetic field monitors placed at selected positions. The magnetic field monitors have two magnetometers with their sensitive axis placed either in the horizontal or vertical direction. A detailed description of such magnetic field monitors is found in U.S. Pat. No. 6,771,058 (Lapinski). The system further includes a central processing facility for the communication of the power flow to an end user.

European Patent No. EP1 297 347 (Genscape Intangible Holding, Inc.) discloses an apparatus for remotely measuring and monitoring an electric power transmission line. The apparatus comprises a first sensor which is responsive to a first component of a magnetic flux density associated with the electric power transmission lines and which outputs a volt proportional to the magnetic flux density generated by current flowing through set electrical power transmission line. The apparatus further includes a second sensor, which outputs a voltage proportional to a net electrical potential associated with the electrical power transmission line. The values for the voltage and the current flowing through the electrical power transmission line are passed to a central processing facility which combines the phase of the measured electrical potential with the phase of the measured magnetic flux density in order to determine the phase of the electrical potential relative to the magnetic flux density and that by determining from the face of the electrical potential relative to the magnetic flux density. The phase angle of the current flowing through the electrical power transmission line with respect to the voltage of the transmission line is also determined. A power factor on the electric power transmission line and the magnitude and the direction of the power flowing through the electrical power transmission line is thereby calculated. It should be noted that the voltage sensor and the magnetic flux sensor are substantially co-located, as can be seen from FIG. 1 of the patent.

Other companies also measure power flowing along electric power transmission lines. For example, the Norwegian company powermonitor.org supplies information about the German power plants. Their product is described in the article "Slik drives strøm-spionasje", Økonomisk Rapport April 2006, 40-41. Another Norwegian Company, Energie-info A S, Stavern, has filed a Norwegian patent Application entitled "Fremgangsmåte og apparat for overvåkning av produksjon og overføring av elektrisk kraft" (Application No. NO 2007 2653).

International patent application No. WO 2013/135773 A1 discloses also an apparatus and a method for monitoring power transmission, disturbances and forecasts in a power grid. The apparatus comprises a plurality of magnetic field sensors or voltage sensors for measuring a change in the magnetic field or voltage over time at the electric power transmission line. The measurements are mainly based on signals from magnetic field sensors, which are prone to interferences.

In the international patent application No. WO 2013/001355 A2 a method for distributed waveform recording in a power distribution system is disclosed. The purpose of the method is fault monitoring and analysis of fault conditions condition in the power distribution system. The method includes one or more instrument transformers along with merging units and a plurality of intelligent electronic devices distributed in a plurality of hierarchical levels. The distributed waveform recording is carried out by at least two devices participating to detect an event for recording and performing waveform recording, where the data for waveform recording and detection of event are based on a single stream of the sampled measured value data.

From international patent application No. No. WO 2007/070255 A2 a system for detecting and locating a disturbance event within a power grid is known. The system includes a series of frequency disturbance recorders taking measurements in the power grid at dispersed points of the power grid, an information management system, configured to receive data from the serious of frequency disturbance recorders and analyze the received data and a communications network interconnecting the series of frequency disturbance recorders and the information management system. The disclosed system is not suitable for retrieving information about the power grid in a regular state as for example power flow.

US patent application No. US 2013/0073108 A1 discloses a real time distributed wide area monitoring system. The system includes a plurality of phasor measurement units that measure respective synchronized phasor data of voltages and currents. The real time distributed wide area monitoring system further includes a plurality of processing subsystems distributed in a power system. At least one of the processing subsystems is configured to receive a subset of the respective synchronized phasor data and to process the received subset of the respective synchronized phasor data to determine respective system parameters.

In US patent application No. US 2012/0310559 A1 a system for distributed data collection in a utility grid is disclosed. The system provides distributed data collection for sensor networks in a utility grid and comprises one or more data collection agents, one or more grid data collection service devices, and one or more points of use. The data collection agents may be configured to generate grid data values that comprise raw grid data values, processed grid data values, or any combination thereof. The data collection agents may also be configured to communicate the grid data values using a communication network in the utility grid to the one or more grid data collection service devices. The grid data collection service devices receive the grid data values in a time synchronized manner and distribute the time synchronized grid data values in substantially real time to the one or more points of use.

A method and apparatus for time synchronization and measurement of power distribution systems is known from US patent application No. US 2011/0208364 A1. The method includes receiving a synchronized wireless communication signal, synchronizing to the synchronized wireless communication signal to produce synchronized time, performing one or more power distribution measurements based on the synchronized time to produce synchronized power distribution measurements, and transmitting the synchronized power distribution measurements to a power control center. The apparatus includes a receiver configured to receive a synchronized wireless communication signal, a measurement module configured to perform power distribution measurements based on the synchronized time, and a transmitter configured to transmit synchronized power distribution measurements to a power control center.

US patent application No. US 2011/0010118 A1 discloses a method and an apparatus for monitoring power transmission in an electric power transmission line. The apparatus comprises a magnetic field sensor for measuring the magnetic field at the electric power transmission line and transmitting magnetic field data to a processor. The apparatus also has a voltage sensor arranged distally from the magnetic field sensor for transmitting voltage waveform data to the processor and a transfer function calculator for calculating the relationship between the transmitted voltage waveform data at the voltage sensor and transmission line voltage waveform data.

From US patent application No. US 2009/0289637 A1 a system and a method for determining the impedance of a medium voltage power line is known. The system and method uses a computer system to provide utility information related to a plurality of underground power line cable segments connected on opposite ends to different distribution transformers. The method comprises monitoring the impedance of underground power line cable segments overtime, detecting a change in the impedance, storing information for identifying power line cable segments, generating a report that identifies the set of the plurality of underground power line cable segments for which a change in impedance is detected, and outputting the report.

Real time power line sag monitoring using time synchronized power system measurements is disclosed in US patent application No. US 2008/0189061 A1. The disclosed system includes a sag calculator, which computes sag for a span of a line section based, at least in part, upon an average temperature of the conductors in the line section. The system also includes a temperature calculator, which determines the temperature and which uses time synchronized power system voltage and current measurements. The voltage and current measurements are generated for example by phasor measurement units.

US patent application No. US 2008/0077336 A1 discloses a power line universal monitor sensor module for measuring global positioning satellite synchronized voltage, current, phase, frequency and derived quantities on the AC power conductor. The disclosed sensor is suitable for installation on and removal from the energized high voltage AC power conductor.

A system and method of monitoring a plurality of electrical assets is disclosed in US patent application No. US 2007/0059986 A1. The system comprises an electricity distribution infrastructure, including a plurality of electrical asset sensors coupled to the electrical assets for monitoring an operating condition of the electrical assets as well as any fault conditions. The sensors may include a current transformer, a GPS receiver for applying a synchronized time stamp to waveform data, and a mesh network radio for transmitting the time stamped waveform data.

From US patent application No. US 2006/0247874 A1 a system and method for synchronized phasor measurement is known. The phasor measurement system includes acquisition circuitry for acquiring voltage or current values from a power line, sampling circuitry for sampling the voltage or current values, and processing circuitry for computing a phasor and at least one time derivative of the phasor based on the sampled voltage or current values and for computing a synchronized phasor value based on the phasor and the at least one time derivative of the phasor.

The prior art systems described in these publications are, for example, expensive due to need of placement of equipment out in the field near to the power lines or insufficient speed in making the measurements, or lack information as to the power flow and direction. The prior art methods are under-determined for the measurement and calculation of power grid parameters and will not work if less than three recorders are used.

SUMMARY OF THE INVENTION

The term "plurality of events" as used in this specification shall be understood as comprising any of the following meanings: several events of a different kind, several events of the same kind, or several occurrences of the same event at different locations. It shall be understood that determining a plurality of events also includes determining a single event at different locations. If, for example, two events are determined at different locations, the two events can be one event at a first location and another event at a second location, or the two events can be the same event that is determined at the two different locations.

A method and a system for measurement of one or more parameters of a power grid is disclosed. The method comprises determining a plurality of events in at least one power waveform on the power grid and recording timings of the plurality of events in at least two locations in the power grid. The differences between the timings recorded at the at least two locations are determined and analysed to determine the one or more parameters. The one or more parameters are selected from the group of parameters comprising power flow, short circuits, added circuits, changes in a circuit, and breaks in the power grid.

The analysis is carried out, for example, by using circuit theory and establishing a set of equations, which are then solved. The analysis is hereafter referred to as circuit analysis. Linear circuit theory can be, but not limited to, a part of the circuit analysis. The set of equations enables the calculation of parameters, such as but not limited to, power flow (including direction and both active and reactive power). The set of equations also enables parameters, such as but not limited to short circuits, breaks in the power grid and other disturbances to be identified. The events recorded include, but are not limited to, peak values, zero crossing points, points of signals passing a predetermined level, points of predetermined phase angles, harmonics, etc.

The one or more power waveforms can be a voltage waveforms. The determining of the plurality of events can be done at a low voltage part of the power grid.

The power flow in the power grid can be determined by using a combination of publicly available information, such as the nominal voltage of electric power transmission lines, and measured voltages and signals on the low voltage part of the power grid, and electromagnetic fields about the electric power transmission lines.

The recording of timings comprises measuring timings using timing data supplied by a global positioning system. These can either received the timing data directly from satellites or use clocks that are regularly synchronised with the timing data.

The method can further comprise further recording of at least one of the plurality of events in the at least one power waveform, the timings of the plurality of events, or the differences of the timings, and using the further recording as a reference value.

The system comprises at least two sensors for sensing a plurality of events in at least one of the power waveforms on the power grid, wherein the at least two sensors are located in different locations in the power grid. The system also comprises at least one timing unit and a processing unit. At least one of the at least two sensors is connected to one of the at least one timing units. The timing unit is configured to record timings of the plurality of events. The processing unit is connectable to the at least two sensors and receives the timings of the plurality of events from the at least two sensors. The processing unit determines differences between the timings sensed at different locations in the power grid, analyses the differences of the timings, and thereby generates values of the one or more parameters. The one or more parameters are selected from the group of parameters comprising power flow, short circuits, added circuits, changes in a circuit, and breaks in the power grid.

The plurality of events in the one or more power waveforms can comprise zero crossing points. The timings of the plurality of events can comprise time tags at the zero crossing points.

The sensors can be located in a low-voltage part of the power grid or can be a field sensor located proximate to an electric power transmission line. The field sensor is adapted to transmit field data relating to an electromagnetic field about the electric power transmission line to the processing unit. The different types of sensors enable different waveform data to be gathered from different ones of the power waveforms and enable different parameters to be calculated.

The system of this disclosure can be used to determine power plants own evolution of the fuel price or water values in the case of a hydro plant. This can be done by measuring the power flow in and out of the power plant and correlating this with the market power price at same time.

The system of this disclosure can be used to determine a spot price for power, both explain historical spot prices, determine spot price trends in real time and estimate forward spot prices.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
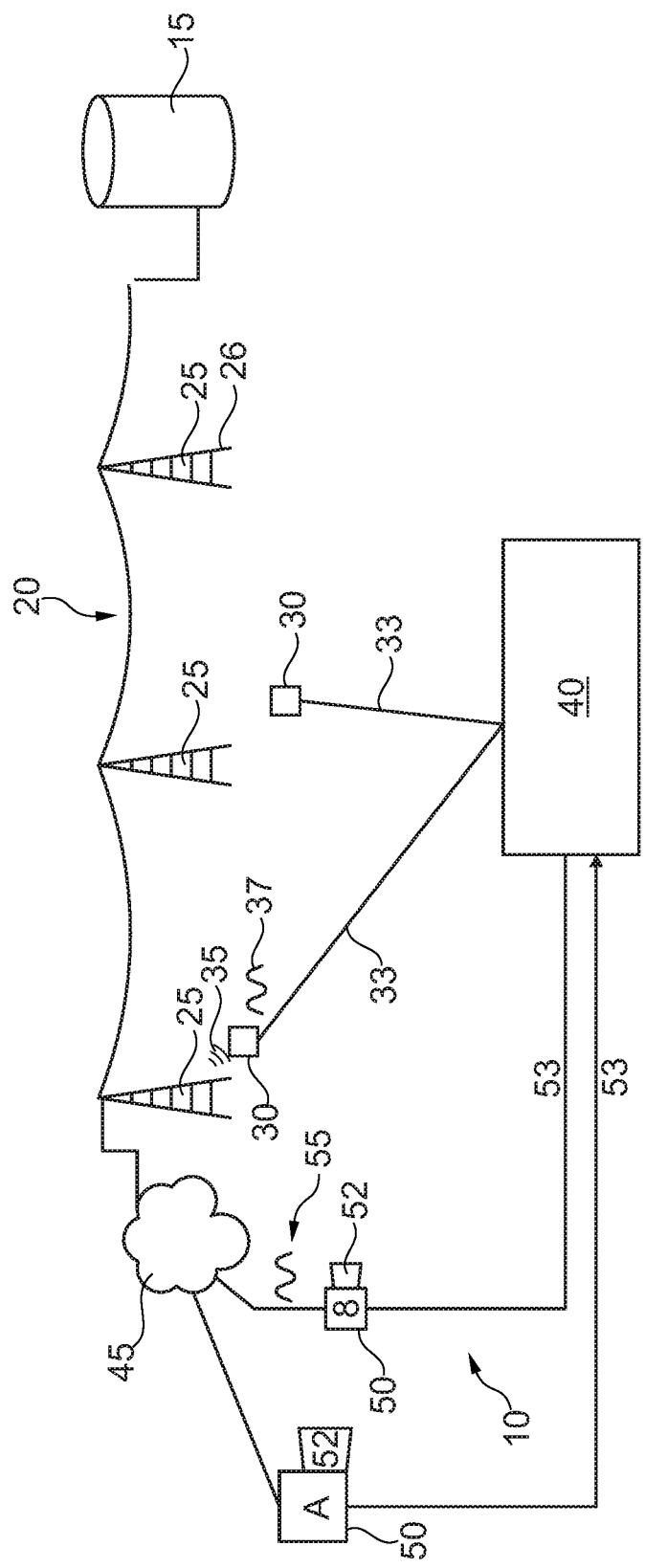
FIG. 1 shows an example of a power grid

FIG. 1 shows an example of a power grid 10 with a system according to one aspect of this invention. The power grid 10 comprises a network 45 to which an electric power transmission line 20 mounted on pylons 25 is connected. A power plant 15 is also connected to the electric power transmission line 20. The network 45 includes a low voltage part to which at least two sensors 50 are connected at positions A and B. Each one of the two sensors 50 has a time tag measuring system 52 connected to them. The two sensors 50 are connected to a central processing unit 40. It will be appreciated that there can be a plurality of electric power transmission lines 20 and a plurality of sensors 50. The two sensors 50 form pairs for determining the power flow between the pair of sensors 50. The purpose of using a pair of sensors 50 is to enable the determination of the phase differences between the two sensors 50, and, by this determination, the phase over the power grid 10 between two nodes or points or two different geometrical locations. The term "phase" in this context refers to a specific condition related to time. For example, the specific condition can be a specific waveform. Typically, a phase is the fraction of the wave cycle, which has elapsed relative to a known time.

In one aspect of the invention one or more magnetic field sensors 30 measuring the magnetic field 35 about the electric power transmission line 20 is included. The magnetic field sensors 30 are also connected to the central processing unit 40 by connections 33.

It will be noted that the connections 53 and 33 can be implemented as a wireless RF transmission or through the Internet, but these are not limiting of the invention.

The method of this disclosure is based on placement of the sensors 50 as low voltage measurement devices connected to a low voltage part of the power grid 10. These sensors 50 can be connected a standard home or office power outlet. One example of the lower voltage part of the power grid 10 is the domestic nominal 230 V network present in most parts of Europe or the 110 V network in the United States.

One example of a standard home or office power outlet is the "Schuko" contact used in many parts of Europe (European Standard CEE 7/4 or CEE 7/7).

The method of the current disclosure measures the shape of the voltage waveform 55 at the standard home/office power outlet and produces a plurality of measurements. The shape of the voltage waveform 55 is measured with reference to a common time domain to enable further comparison and calculation with other measurements performed at different times and in different locations. A phase relation between the plurality of measurements is used to determine parameters indicating the conditions of the power grid 10. The conditions include, but are not limited to, the power flow, the power direction, the phasors at various points representing current and voltage, and expected conditions in the near future.

The teachings of this disclosure consider the power grid 10 to form one circuit and use linear circuit theory to calculate the parameters, but the teachings are not limited to the application of linear circuit theory. A skilled person will have sufficient knowledge in circuit theory to be able to do the calculation. For the sake of easier understanding, some parts of the theory are described below.

Let us assume that the power grid 10 is built up of a plurality of objects, as an example of a first minimal complex circuit, with each of the objects having impedance, and, in addition, a plurality of switches. We know that the impedance Z is given by $$Z = R + jX \qquad \text{Eqn. 1}$$

wherein R is the resistance and X is the sum of the reactance in the objects. For example $X = XL - XC$. XL is the inductive part of the reactance and XC is the capacitive part of the reactance.

The relationship between the self-inductance L of an electrical circuit (in Henries), voltage, and current is given by the equation $$V(t) = L \, di/dt \qquad \text{Eqn 2}$$

where V(t) denotes the voltage at time t in volts and i the current in amperes.

The relationship between the capacitance and voltage/current is given by $$I(t) = C \, dV(t)/dt \qquad \text{Eqn. 3}$$

An analytic expression representing the power grid 10 can be constructed and the equations in the analytic expression can be solved by analytic mathematics alone or combined with empirical evidence (based on physical measurements), publicly known historical information and publicly known external real-time information to derive the parameters.

According to eqn. 2, it is assumed as a simple example that a voltage signal in the form of a sinus pulse is injected at one end of the system (an electrical line in this example).

The pulse injected or fed into the system can also be a square pulse, a ramp, a sag tooth pulse and the like. The pulse changes over time and the pulse is known in the time domain. At the output of the system (the electrical line in this example), the output signal (i.e., the propagated pulse) in the time domain is measured. The phase of the signal between the input of the electrical line and the output of the electrical line will change as a function of the current in the electrical line. The function describing the phase is a part of the transfer function of the system. If there already is a voltage signal (as in a main power outlet), it is not required to inject a voltage signal. In this case, the phase of the existing voltage signal at the input end, the phase of the voltage signal at the output end, and the phase difference is to be measured by use of a global clock. Thus, it will be possible to find the current as a function of the phase difference.

It is to be noted that phase changes and changes of the frequency are based on different physical parameters and events in a power grid 10. For this reason, the phase measurement and the measurement of the frequency cannot substitute each other. This is illustrated by the following example. A blackout of the power plant 10 causes the frequency to be reduced for a short period because there is not enough power-producing reserves available to maintain the frequency. After the short time, the power reserves in the power grid 10 will have compensated for the loss of power and the frequency will be restored to the nominal frequency again. A blackout of a power plant forces the current to take other paths in the power grid 10. Thereby the phases are changing, in both the short term and permanently after return to a steady state of the power grid. A conclusion is that measuring of frequency only shows small parts of the physical properties of the power grid 10. In some cases, frequency measurements may be a useful contribution to the phase measurements to explain the complete physical properties.

The frequency may change due to overload of the power grid 10. This usually happens due to lack of "mass" in the power plants and the power grid 10. The frequency will change significantly less, at a slower rate and in a different manner due to lack of "mass" than the phase change due to changed current as explained in this disclosure.

It is to be mentioned that it can be useful in rare cases to measure the frequency in addition to the phase difference measurements explained in this disclosure in order to fully understand the events in the power grid 10. For example, if the frequency changes this is an indication that the event is related to a sudden production change or a demand change and not caused by adding or removing lines. Normally it will only be needed to measure frequency at one point in the power grid 10, and it is not needed to do multiple frequency metering or any frequency event triangulation.

Examples A, B and C show simplified simulated examples of phase changes as taught in this disclosure. In the examples, the phase is calculated by a simulation program. It is not known from prior art to calculate the high voltage power flow based on the measurement of the phase in a main power outlet (110V or 230V).

The abbreviation ssk used below in combination with a three-digit number labels a certain point in the power grid 10. For example, the point can be a sub-station bus connection. For the sake of brevity, the abbreviation ssk is omitted in the illustration of the three examples A, B and C in FIGS. 4a, 4b and 4c; only the three-digit numbers are given in the figures.

Figure 4A:
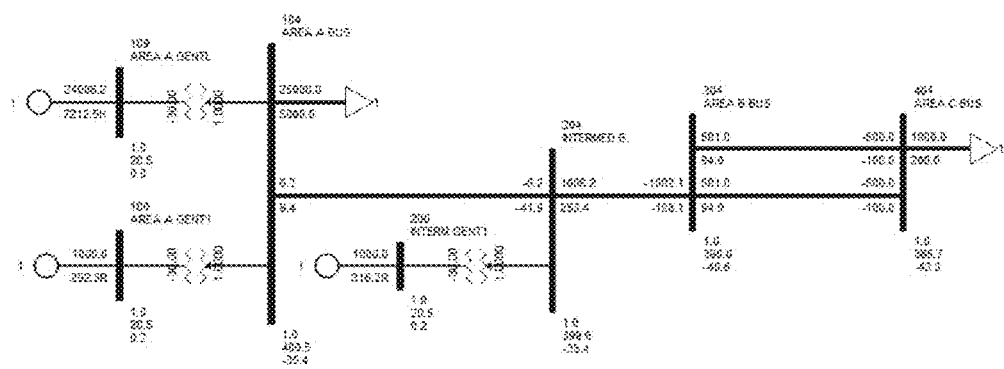
FIG. 4a shows a simplified simulated example of phase changes according to a scheme A as illustrated in the description.
Figure 4B:
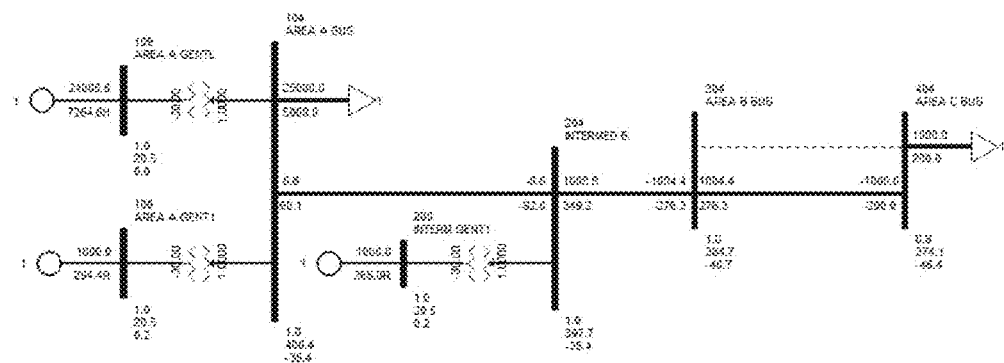
FIG. 4b shows a simplified simulated example of phase changes according to a scheme B as illustrated in the description.

The following description refers to example A illustrated in FIG. 4a. At an initial stationary start, there is a production of 25006.2 MW in bus 109, a flow of 6.2 MW between ssk 104 and ssk 204, a production of 1000 MW at ssk 204, a stabile stationary 50 kHz frequency and a phase difference of 2.7 deg between ssk 304 and ssk 404. I.e., the frequency does not give any information other than the system is probably stable. For the cables (ssk 304 to ssk 404) it will be known either by measurement or analytically calculated from knowledge about the power grid 10, wires or lines that a phase difference of 0.27 deg corresponds to a flow of about 100 MW from ssk 304 to ssk 404. By measuring a phase difference of 2.7 deg as in this case A. it is possible to calculate the flow to be about 1000 MW from left to right (ssk 304-ssk 404), i.e. as taught in this disclosure it is possible to calculate the flow of the power by measuring the phase difference in the power grid 10. The following example refers to example B illustrated in FIG. 4b. There is a production of 25008.8 MW at the left, a flow of 8.8 MW between ssk 104 and ssk 204, a production of 1000 MW at ssk 204, a stabile stationary 50 kHz frequency and a phase difference of 5.7 deg between ssk 304 and ssk 404. I.e., the frequency does not give any information other than that the system is probably stable (even if the system is in fact not stable). Let us suppose in example B that one of the cables between ssk 304 and 404 is broken. From knowledge of the cables (ssk 304 to ssk 404 with two cables) it is known that a phase difference of 0.27 deg corresponds to a flow of about 100 MW from left to right. By measuring a phase difference of 5.7 deg as in this example B, a flow of about 2100 MW from left to right (ssk 304-ssk 404) would be calculated, which is not correct (the correct flow is still about −1000 MW). By inspecting the frequency very carefully no changes from the usual fluctuations would be noticed when the events happen (one broken line), i.e. the frequency would not contribute any information. But by inspecting the phase difference between ssk 304 and ssk 404 in the time-domain when the event happens, a sharp and sudden step would be observed. By comparing this step in the phase with an estimated step in the phase if one line becomes broken, it would be possible to decide that there is one broken line and not a large increase in the power flow. It should also be mentioned that the step or the sudden change of the phase in the time domain is so rapid that it would not be possible to measure this step in the time domain in a low pass (10 Hz to 10 kHz sample) frequency measurement. The systems described in this application typically run at a sample frequency well above >10 kHz. Thus, the systems are capable of measuring phase changes within a time frame of less than 20 milliseconds.

Figure 4C:
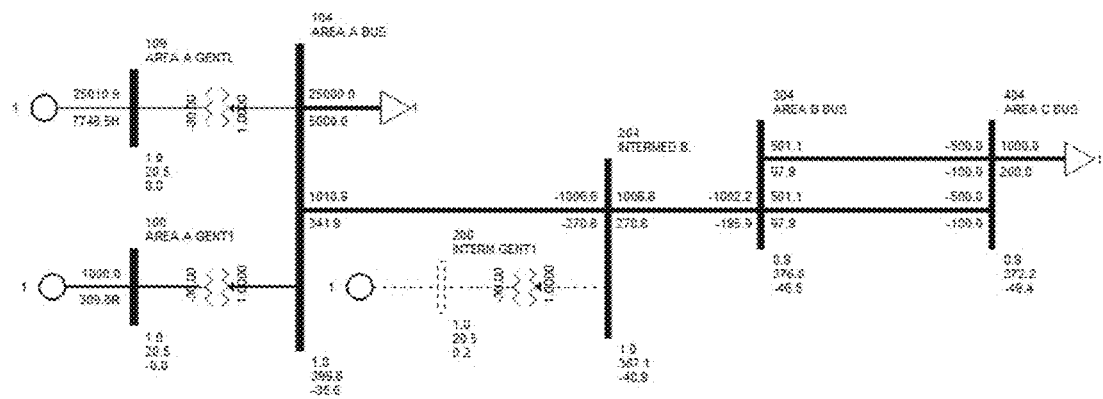
FIG. 4c shows a simplified simulated example of phase changes according to a scheme C as illustrated in the description.

The following example refers to example C illustrated in FIG. 4c. There is a production of 25010.9 MW at the left, a flow of 1006.6 MW between ssk 104 and ssk 204, a stabile stationary 50.0000 Hz frequency and a phase difference of 2.9 deg between ssk 304 and ssk 404. In the example C the 1000 MW power generator at ssk 204 has received a black out. By measuring the phase 2.9 deg it is possible to calculate the power flow between ssk 304 and ssk 404 to be about 1070 MW, which is correct (7% to high). If the power plant had one very rapid black-out it could be observed by inspecting the frequency that the frequency slightly falls until (in a few seconds) the other power producers start to increase their production of power to compensate for the loss of power. However, it would be difficult to understand if it was a rapid power down or a rapid increase in consumption or to limit the possibility of changes outside of the grid shown in example C. Examples for such changes are: consumption changes, production changes, switching of power lines, broken power lines etc. If there are more than two frequency measurement units it would be possible to use triangulation to roughly find the location of the event due to delays in the regulation systems and frequency delays in the power grid 10. If the blackout of the power plant was not rapid but a controlled ramp down, no frequency changes from steady state would be measured at all. If the phase between only the two points ssk 104 and ssk 404 instead of between the points ssk 304 and ssk 404 is measured, the black out of the power plant could be clearly determined, both in short real-time (<1 s) and after return to steady state of the power grid (1-10 s) and both for a rapid and a slow ramp down.

The method of measuring phase angles between two points as described in this disclosure can be used as a stand-alone method to find almost all of the parameters of the power grid 10, in particular the power flow in the lines. It will be also possible to determine the power production or power consume in areas by summing up all of the measured power lines.

The method of measuring phase angles between two points as described in this disclosure can be enhanced by also measuring one or both electromagnetic fields both for current calculation, but also the phase nearby one of the power lines. As an example in example C, measuring the magnetic field surrounding the line from the power plant to the ssk 204 would contribute enough information to determine the blackout and total power flow in the system by only two phase measurement units (one at ssk 304 and one at ssk 404).

By adding known public information, for example the maximum capacity of the lines between ssk 104 and ssk 404, it could be known that the maximum angle to measure will be roughly 8 deg, when the power plant is in an operating state.

In circuit theory, the relation between voltage and current at different locations (along the electrical lines) in the power grid 10, or at different times (in the time domain), is termed the transfer function and is denoted T. This is described in more detail in co-pending patent application publication No. US 2011/0010118.

If we have a given condition, X, in the power grid 10, and there is a change at time t in the power grid 10 at position A we would, by use of the transfer function T, be able to predict a change at position B per time given by the matrixes:

$$\frac{\partial B}{\partial t} = T \frac{dA}{dt} X \qquad \text{Eqn. 4}$$

Oppositely, if we see a change at the position A and a change at the position B at the time t, and we know the transfer function T, we are able to calculate the condition, X:

$$\frac{\partial B}{\partial t} \frac{dt}{dA} T = X,$$

$$\text{or } X = T \frac{dB}{dA} \qquad \text{Eqn. 5}$$

Figure 3:
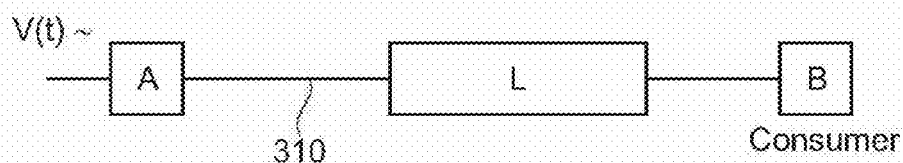
FIG. 3 shows an example of a power line and measurement setup.

This can be best understood using a very simplified example, as shown in FIG. 3. Suppose that we want to find the power flowing in a circuit 310 with a sinus alternating voltage V(t) (non-limiting example at 50 Hz or 60 HZ) to a consumer at a position B.

Suppose also that there was only inductance L in the circuit 310 in addition to the load at the position B, the value of which is unknown. We want to find the power flowing from V(t) to a consumer at the position B.

The voltage Vx at a point x at time t between the position A and the position X in the circuit 310 is given by $$Vx(t) = V_0 \sin(\omega t + \varphi_{AX}) + L_{AX} \frac{di}{dt}. \qquad \text{Eqn. 6}$$

In other words, the value of the inductance $L_{AX}$ between the position A and the position X adds a sinus voltage $V_L(t)$ that slightly out of phase of the Vx(t). The $V_L(t)$ voltage will be proportional to the change in current over time. If we then measure the phases of the voltage at the position A (phase $\varphi_A$) and the position B (phase $\varphi_B$) we will be able to calculate the current I(t) at time t, $$V_B(t) = K_1 \sin(\omega t + \varphi_A) + K_2 I(t) \sin(\omega t + \varphi_B) \qquad \text{Eqn. 7}$$

Or $$I(t) = K_3 \frac{\sin(\omega t + \varphi_A)}{\sin(\omega t + \varphi_B)} \qquad \text{Eqn. 8}$$

This can be applied in practice as follows. As an example, suppose we want to find the power [in Watts] flowing in the network 45 in the power grid 10.

First, we measure the values of dB/dA at different locations in the power grid 10. This measurement can be measured by installing a time tag measurement station (TTMS) 52 as shown in FIG. 1 at two different geometrical grid locations (position A and position B) in the power grid 10, for example two different wall power outlets (230VAC) that are linearly coupled to the power grid 10. Each one of the TTMS 52 are synchronised by a very accurate clock. This clock can be generated, for example, from a GPS receiver receiving timing signals from a satellite.

Each one of the TTMS 52 measures the time at which the sinusoidal curve of the voltage signal 55 crosses the zero axis related to a global clock. If we then compare the two TTMS measurements it is possible to measure the dB/dA ratio (or delta), or in other words the phase difference between the voltage signals at the two TTMS 52, or the phase relationship between the two different grid positions A & B.

It will be understood that the invention is not limited to power grids 10 with linear couplings. If the wall power outlets or parts of the power grid 10 are not stationary linearly coupled or if there are not linear couplings, it will also be possible to implement an additional secondary transfer function which handle and correct for the phase shift in the not static or nonlinear part of the power grid 10. The transfer function can either be found by empiricism or found by known analytic functions or a combination.

It will be appreciated that the disclosure is not limited to measuring the voltage zero crossing point. It will also be possible to measure the current (as explained in co-pending application publication No. US 2011/0010118) or the phase of the voltage field underneath one or more of the high voltage power line 20 in the power grid 10, or a combination of a plurality of voltage, current, voltage field etc. The teachings of this disclosure are also not limited to measuring the zero crossing point of a sinusoidal signal, other parts of the signal, deviations in a sinus, higher or lower frequencies or over harmonics, or overlaying signals or ramps (example from consumers or power producers) can also be used.

In this current example, we want to find the power and so we use the outlined method to find the current I. We determine X to be the unknown current [Ampere] condition of a wire in the power grid 10, and solve the $$X = T\frac{dB}{dA}$$

part using Eqn. 5.

We can find the nominal voltage $V_0$ from public information. We can also determine the nominal voltage $V_0$ from field measurements, either by a single measurement or by continuous measurements.

We then solve the equation:

$$\int_0^{2\pi} P(t) = \int_0^{2\pi} V(t)I(t)\,dt \qquad \text{Eqn. 9}$$

that will give the power flow P (t) at a given time, both value and direction.

$$P = K_4 \int_0^{2\pi} \frac{\sin^2(\omega t + \varphi_A)}{\sin(\omega t + \varphi_B)}\,dt \qquad \text{Eqn. 10}$$

The variable ω (50 or 60 Hz) and the voltage $V_0$ can be found from public information and set as constants. Initial constants, such as an arbitrary initial current value $I_0$, or initial voltage value $V_0$, will be found either from public data (urgent market messages, price etc.), historical data, empirically, measurement of other types (electromagnetically nearby the wire out in the field). Alternatively the initial states may not be relevant because it is the change in power, (dP(t))/dt, which is of interest and not the initial condition of the power P (0).

If the transfer function T is known a change in power can be found in absolute real-time. The value measured, with only two measurement units, is in practice only limited to the resolution and accuracy of the clock and phase measurements, for example within a few nanoseconds using GPS synchronisation from the GPS receiver. This compares favourably with existing methodologies. For example, the frequency measurement systems taught in International Patent Application No. WO 2007/070255 (assigned to Virginia Tech Intellectual Properties) need several periods to detect changes in the power grid 10, need a series of measurement units (3 or more) to be able to triangulate to find the rough location of an event and does not disclose a methodology to measure the value of the power flow value or direction.

The novel method described in this disclosure is based on measuring the change in current over time, di/dt, or the change in voltage over time, dv/dt which are the factors directly affected by a change in the circuit.

One use of the novel method is detecting an outage of a power plant, a short circuit in the power grid, a break in the power grid 10 or a sudden increase in need of power from consumers.

The measurement at several locations in the power grid 10 means that it is also possible to solve the equations in respect of the geometrical domain, or both in the time domain and the geometrical domain. This means, for example, if several power plants (or consumers) are connected to the electric power transmission line (or the power grid 10) we can by solving the equations (or simplified by triangulation) and figure out which specific power plant (or which one of the consumers) causes a disturbance in the electric power transmission line (or the power grid 10).

Example 1

Figure 2:
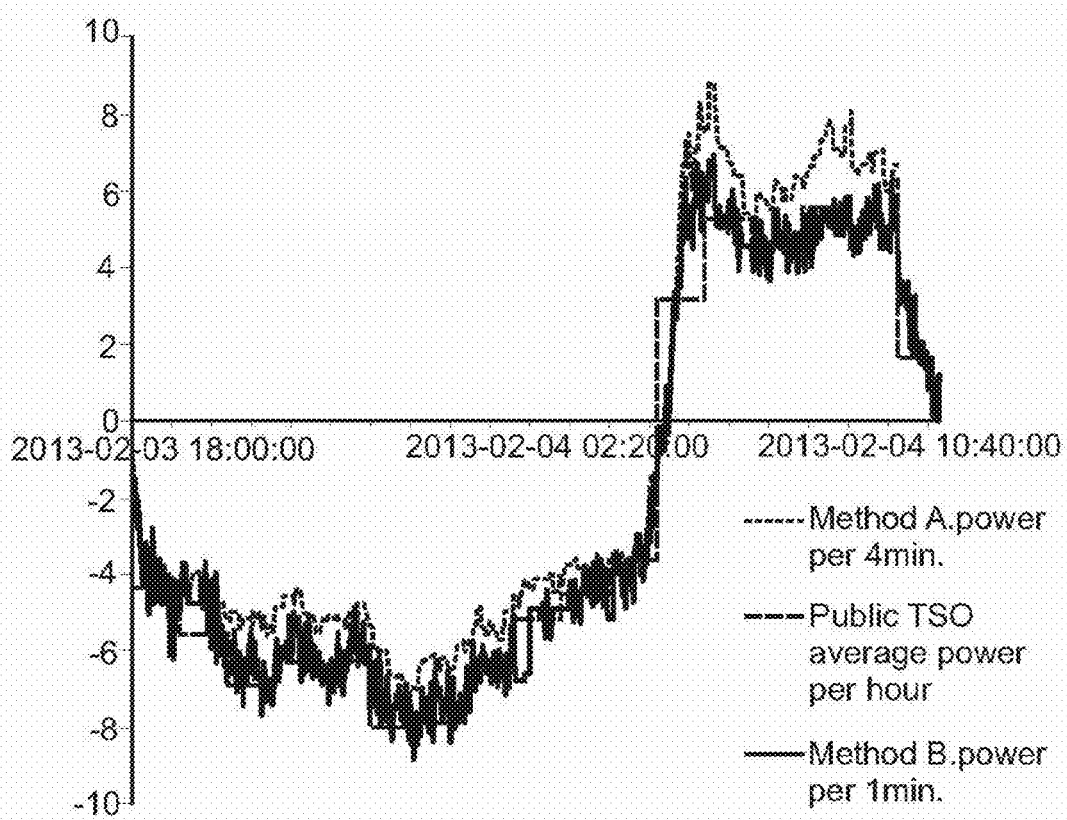
FIG. 2 shows an example of a measurement.

This can be demonstrated by an empirical example. FIG. 2 shows a real measurement of the power flow from Norway to Sweden. In this example, the voltage phase is measured at a standard 230VAC power outlet by two TTMS 52. One of the TTMS 52 is located in the centre of Oslo (about 100 km north of the border) and a further one of the TTMS 52 is located in Gøteborg (about 200 km south of the border). Both of the TTMS 52 are installed in a standard office power outlet.

A simplified transfer function T between Oslo and Gøteborg is found from using standard formulas of impedance in a 3-phase triplex power line. The nominal voltage released publicly is given to be 430 kV, but by empirical measurement over long time using the methods described in this application, it has been found a more correct voltage of about 410 KV.

Both of the TTMS 52 use a GPS receiver to determine UTC time and we were able to, in substantially real-time, calculate the phase difference between the TTMS 52 in Gøteborg and the TTMS 52 in Oslo. The phase relation between the Oslo volt phase and the Gøteborg volt phase is used in a simplified static formula to calculate the power flow in MW along the electric power transmission line 20 in the power grid 10, as is shown in FIG. 2.

The x-axis is the time over about 3 days. The y-axis is the active power flowing in MW. The short dashed line is the public data per hour as given by the Norwegian TSO Statnett. Statnett publish this data with a time lag of about one hour. The longer dashed line is real-time field measurement done every four minutes by the method as described in US Patent Application No. 2011/0010118. The continuous line is the measurement done by the method as described in this disclosure. In the example shown in FIG. 2 the measure is made per minute. The measurement can easily be increased to per sub second. It can be seen that the power is changing direction several times.

The method described in this disclosure calculates the active power (and absolute values) which closely follows the published Statnett data. This demonstrates that the method described removes the reactive parts of the power as long as we solve the equation after $\int_0^{2\pi} P(t) = \int_0^{2\pi} V(t)\,I(t)\,dt$ has been included in the set of equations.

In this case, the measurement is carried out without any physical access to the high voltage electric power transmission lines forming the power grid 10 or accessing property owned by the power producers, the TSO or third party consumers.

Example 2

Example 1 used two TTMS 52 located at each end of the power grid 10 to be measured (Norway-Sweden). In another example we have calculated the power flow (Norway-Netherlands) with both of the TTMSs 52 located in Norway and no TTMS 52 located at the end of the circuit.

A plurality of measurement stations, for example N TTMS 52, is used. These allow the measurement and determination of N−1 parameters, such as but not limited to grid power flows [MW] between M areas with M TTMSs, i.e. one TTMS 52 in each area. An area in this context can be an economic area, a producer area (for example where a power plant is located), a consumer area (for example a factory area, milling area, gas/oil production area etc.), etc.

Let us suppose a change occurs in one area. An example would be power plant outage, grid instability, grid beak down, gas pump start, etc. It is possible to determine the change or event.

By comparing when the change happened for several ones of the TTMS 52 one can calculate the geographical point of the origin of change. This because the transfer functions have components of both time and space. We can decide which of the variables can be set as unknown.

An example will illustrate this. Let us suppose that the TTMSs A, B, C and D are all located in the power line, and one power plant P is located in the power line.

---A--------------B------------------C--D---------------
P------------------------

The phase relation between B and C can be used to calculate the power flow out of the power plant P in the left-hand direction. The phase relation between B and D can be used to calculate the power flow out of the power plant in right direction, even although the TTMSs B and D are located on the left hand side of the power plant P. Using these results we will be able to in real-time measure and calculate the net power production [Watt] for the power plant P on the right side of D. If we measure the phase relation between A and D, we can also calculate the location of P [meter] along the line. By inspecting the examples A., B. or C. as taught elsewhere in this disclosure the same results will be given, by inspecting the phase over one line it will be possible to also measure lines or events elsewhere in the power grid 10.

Example 3

By use of the standard magnetic field sensor 35 (using coils etc., such as known from international patent application No. 2013/055156) one can measure the magnetic field 35 surrounding the power line 20 and calculate the current in the electric power transmission line 20. In this example the current was not measured, but the reactive power at two locations of the power grid 10 in Norway.

The reactive power (I-U angle) at the power plant Geilo was measured to be 31 degrees. The reactive power at Hønefoss, further south, was found to be 20.4 degrees. In other words there was a reduction of 8.9 degree (equivalent to about 500 microseconds) in reactive power. This value corresponds to a current of 2000 Amps flowing, or about 800 MW flowing from Geilo to Hønefoss, if we assume a voltage on the power line 20 of about 410 KV. This power flow is measured without any physical access to the power grid 10 at all. If we neglect the voltage phase change over the power grid 10, we can measure the power flow and power direction using only magnetic field measurements without the need, for example, of voltage sensors or electrical potential sensors It will be noted that the individual components which are a part of the circuit and transfer function (inductance, switches, load changes, producer regulation etc.) will, if not static, generate voltages (and currents). This will generate single or several fluctuations on the power grid 10, until steady state is achieved, and will mean that the frequency or periodic time is not exactly 1/50 Hz or 1/60 Hz in US, but changing by typically +− a few µs (microseconds). This causes both the I-I, I-U and U-U phase to be slightly changed. Here, I-I, I-U and U-U are the phase differences between the two locations. The symbol U refers to a voltage waveform and the symbol I refers to a current waveform. Collectively the voltage waveform and the current waveform are referred to as power waveforms. This effect may be important if one does not have a full overview of the transfer function between the two locations and the cause of the period stretching or scrimping is not the unknown parameter. Even it is to be noted the methods described in this disclosure are based on different principles than the principles changing the frequency (typical due to mismatch in grid energy), and thereof is very little sensitive for fluctuations in the frequency.

It should be noted that the method described in this disclosure will have the ability to see the events and status of the power grid 10 in both a static view and in a dynamic view. Observing both the changes per time of the power grid 10 and the state of the power grid 10. The prior art systems using measurement of the frequency on the power grid 10 will often not be able to determine a difference between an event of importance and a normal grid operator adjustment (regulating) to secure the nominal frequency.

Normally the period stretching or scrimping is very low (a few microseconds) compared to the parameter to be measured, for example several hundred microseconds as in the Geilo-Hønefoss example above. In a case with a large power grid 10 or power plant 15, the breakage of the circuit will cause the value of di/dt to be very large as the change in current is very large in a short time period. This may often cause a total di/dt, which is several times larger than the normal value and can result in large changes and fluctuations of the period time, within a very short time. In this case, if we inspect the grid instability, we can optimally measure a grid event within less than one period (EU<1/50 s or US<1/60 s).

This prior art methods, which measure only the frequency, will in some cases only measure a slightly changed frequency, or no change in frequency at all. One example is if the periodic time fluctuates but the average is stable. The prior art methods may also need several periods to be able to calculate the average frequency. It should also be noted that grid operators attempt to force the average frequency to 50 Hz (or 60 Hz US), as long as there is no total breakdown of the power grid 10. The system described in this disclosure will operate quite well, even if we do not have a full break down, and still provides information of the type, complex power, power flow direction, the tendency of the break down, the spread of any disturbance events in the power grid 10, quantitative information etc.

Determination of Spot Price

It is possible to use the method to estimate future prices in a real-time power price spot market. An example of a first order function to estimate the price in an area can be done by:

$$Q(t) = Q_0 - Q_{lag} + K_1 * \frac{dP(t)}{dt} \qquad \text{Eqn. 11}$$

in which Q(t) is the price at a given time, $Q_0$ is the initial price, $K_1$ is a constant, $Q_{lag}$ is the price change after a given time lag due to slowness in the market, and (dP(t))/dt is the change in flow of power in or out of the price are per time. The values of $K_1$ and $Q_{lag}$ can be found empirically and we can estimate the new price in the future Q(t+lag) at a given measured (dP(t))/dt. The equation 11 can be adjusted and have more terms to get more accurate estimates. For example, the term K_1*(dP(t))/dt can be replaced by a more complex function, typically an S function.

Tuning of Parameters and Algorithms

It will quite often be lacking some parameters in the method to solve for the parameters of interest, or to make the matrix of equations deterministic or over deterministic. For example, if the equation with respect to the unknown power flow is to be solved, the grid voltage will be a typical unknown parameter, which is easy to get from public data.

Another way of tuning and solving the equations is to use data from external sources. For example, power plants, the grid operator, reliability councils, the authorities, other organisations etc. quite often publish data. This can be grid parameters, nominal, historical or in close to real-time, example grid voltage, reactive power, active power, urgent market messages, outages, changes in the grid, fuel reservoir levels, prices.

By making routines or systems to feed this data into the system it is possible to continuously adjust the parameters or the unknowns to make the system have an as little as possible error output.

For example, a public organisation publishes the water level in a river above and/or below a power plant one time per day. By use of the methods described in this disclosure the power flow from the hydro power plant to a substation far away can be determined. The voltages on the power lines or anything about the power flow in MW are not known. Only the distance from the power plant substation is known. It is then possible to use the formula for the production [in MW] of this type of power plant with respect to the water height difference above and below, and use this to calibrate the measurement into MW.

Power Quality

The methods and equipment described above can also be used to analyse, record or define the power quality. The power quality may be described by parameters such as deviations from nominal voltage, the frequency or deviations in the sinus shape.

REFERENCE NUMERALS

10 Power Grid
15 Power plant A
20 Electric power transmission leave
25 Pylon
30 Field sensor
33 connections
35 Magnetic field
40 Central Processing Unit
45 Network
50 Voltage sensor
52 Time tag measuring system
53 connections
55 Voltage signal
310 Circuit

The invention claimed is:

1. A method for measurement of power flow in a power grid, the method comprising:
   determining using at least two sensors a plurality of events solely in at least one voltage waveform at a low-voltage part on the power grid, wherein the low-voltage part of the power grid is at a main power outlet;
   recording, using a time tag measuring system connected to the at least two sensors, timings of the plurality of events in at least two different locations in the power grid;
   determining differences between the timings recorded in the at least two different locations in the power grid; and
   analysing the differences of the timings to determine the power flow.

2. The method of claim 1, wherein determining the plurality of events in the at least one voltage waveform comprises:
   determining a point in the at least one voltage waveform at which the at least one voltage waveform passes a given level.

3. The method of claim 1, wherein determining the plurality of events in the at least one voltage waveform comprises:
   determining a point in the at least one voltage waveform at which the at least one voltage waveform has a given phase angle.

4. The method of claim 1, wherein the recording of the timings is done by time tagging, using the time tag measuring system, the at least one voltage waveform at the plurality of events in the at least one voltage waveform.

5. The method of claim 1, wherein the recording of timings comprises measuring timings using timing data supplied by a global positioning system.

6. The method of claim 1, wherein the analysing of the timing differences comprises solving a plurality of differential equations.

7. The method of claim 1, wherein the one or more parameters are determined by applying circuit analysis to a circuit formed by the power grid.

8. The method of claim 1, wherein the analysing of the timing differences comprises using empirical information for calibrating the one or more parameters.

9. The method according to claim 1 further comprising:
   measuring a frequency of the at least one voltage waveform in at least one of the at least two different locations in the power grid.

10. The method of claim 9, wherein the determining of the one or more parameters further comprises at least one of:
    analysing the measured frequency of the at least one voltage waveform;
    analysing over-harmonics of the at least one voltage waveform; and
    analysing lower frequencies of the at least one voltage waveform.

11. The method of claim 1, further comprising:
    further recording at least one of the plurality of events in the at least one voltage waveform, the timings of the plurality of events, or the differences of the timings, and using the further recording as a reference value.

12. The method of claim 1, wherein the determining of the plurality of events in the at least one voltage waveform is done either out in the field or connected to the power grid.

13. The method of claim 1 further comprising:
    using externally published data as an input in a routine for adjusting the accuracy of the determination of the one or more parameters.

14. The method of claim 1, wherein the one or more parameters further comprise a power quality and wherein the power quality is analysed or recorded or provided to the end user.

15. A system for the measurement of power flow in a power grid the system comprising:
    at least two sensors for sensing a plurality of events in at least one voltage waveform at a low-voltage part only on the power grid, wherein the at least two sensors are located in different locations in the power grid, wherein the low-voltage part of the power grid is at a main power outlet;

at least one timing unit for recording timings of the plurality of events, wherein at least one of the at least two sensors is connected to one of the at least one timing units; and a processing unit connected to the at least two sensors, the processing unit being configured to receive the timings of the plurality of events from the at least two sensors, determine differences between the timings sensed at different locations in the power grid, analyse the differences of the timings, and generate values of the power from the analysed differences of the timings.

16. The system of claim 15, wherein the plurality of events in the at least one voltage waveform comprises zero crossing points and wherein the timings of the plurality of events comprise time tags at the zero crossing points.

17. The system of claim 15, further including a field sensor for sensing an electromagnetic field around an electric power transmission line, wherein the field sensor is located proximate to the electric power transmission line, and wherein the field sensor is adapted to transmit field data relating to the electromagnetic field from the field sensor to the processing unit.

18. The system of claim 17, wherein the field sensor senses a magnetic field around the electric power transmission line.

* * * * *